(12) United States Patent
Cheng et al.

(10) Patent No.: US 9,578,742 B1
(45) Date of Patent: Feb. 21, 2017

(54) CIRCUIT BOARD STRUCTURE AND METHOD FOR MANUFACTURING THE SAME

(71) Applicant: Unimicron Technology Corp., Taoyuan (TW)

(72) Inventors: Shih-Liang Cheng, Taipei (TW); Dyi-Chung Hu, Hsinchu County (TW); Yu-Hua Chen, Hsinchu (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 14 days.

(21) Appl. No.: 14/821,819

(22) Filed: Aug. 10, 2015

(51) Int. Cl.
| | |
|---|---|
| *H05K 1/11* | (2006.01) |
| *H05K 3/00* | (2006.01) |
| *H05K 1/02* | (2006.01) |
| *H05K 3/40* | (2006.01) |
| *H05K 1/09* | (2006.01) |
| *H05K 1/18* | (2006.01) |

(52) U.S. Cl.
CPC ............... *H05K 1/11* (2013.01); *H05K 1/0274* (2013.01); *H05K 1/0298* (2013.01); *H05K 1/09* (2013.01); *H05K 1/182* (2013.01); *H05K 3/007* (2013.01); *H05K 3/0017* (2013.01); *H05K 3/0097* (2013.01); *H05K 3/4038* (2013.01)

(58) Field of Classification Search
CPC .......... H05K 1/11; H05K 1/182; H05K 3/007; H05K 3/0097; H05K 3/0017
See application file for complete search history.

(56) References Cited

FOREIGN PATENT DOCUMENTS

| TW | 200623318 | | 7/2006 |
|---|---|---|---|
| TW | 201407726 | A | 2/2014 |
| TW | 201513753 | A | 4/2015 |

*Primary Examiner* — Jeremy C Norris
(74) *Attorney, Agent, or Firm* — CKC & Partners Co., Ltd.

(57) ABSTRACT

A method for manufacturing a circuit board structure is provided. First, a first circuit layer is formed on a carrier. Then, a first dielectric layer is formed on the carrier and the first circuit layer. Thereafter, at least one first hole is formed in the first dielectric layer to expose a portion of the first circuit layer. Then, a second dielectric layer is formed on the first dielectric layer and the first circuit layer. Thereafter, at least one trench and at least one second hole are formed in the second dielectric layer, in which the trench exposes a portion of the first dielectric layer, and the second hole exposes the portion of the first circuit layer. The second hole is disposed in the first hole. Then, a metal layer is formed to fill the trench and the second hole.

9 Claims, 6 Drawing Sheets

CIRCUIT BOARD STRUCTURE AND METHOD FOR MANUFACTURING THE SAME

BACKGROUND

Technical Field

The present disclosure relates to a circuit board structure and a method for manufacturing the circuit board structure.

Description of Related Art

With the rapid growth of electronic industry, the R & D of electronic products is gradually directed to the pursuit of versatile and high performance. In order to achieve the requirements of high integration and miniaturization of semiconductor components, the requirements of circuit boards also increase. For example, the line width and pitch of a circuit board are required to be smaller and smaller, the layout density of the circuit board is required to be higher and higher. In addition, in order to increase the layout density of the circuit board, the circuit board with embedded lines becomes a mainstream trend.

To further improve various characteristics of a circuit board, persons in the industry all endeavor to search the solutions. How to provide a circuit board with better characteristics is one of the important research topics, and is also a target that needs to be improved in the related fields.

SUMMARY

This disclosure provides a method for manufacturing a circuit board structure to improve the layout density of the circuit board structure.

In one aspect of the disclosure, a method for manufacturing a circuit board structure is provided. The method includes forming a first circuit layer on a carrier; forming a first dielectric layer on the carrier and the first circuit layer; forming at least one first hole in the first dielectric layer, in which the first hole exposes a portion of the first circuit layer; forming a second dielectric layer on the first dielectric layer and the first circuit layer; forming at least one trench in the second dielectric layer, and forming a second hole in a part of the second dielectric layer corresponding to the first hole, in which the trench exposes a portion of the first dielectric layer, the second hole exposes the portion of the first circuit layer and is disposed in the first hole, and a diameter of the second hole is smaller than a diameter of the first hole; and forming a metal layer filling in the trench and the second hole, in which a portion of the metal layer filling the trench becomes a second circuit layer, and another portion of the metal layer filling the second hole becomes a conductive via.

In one or more specific embodiments, the trench and the second hole are formed simultaneously.

In one or more embodiments, the trench and the second hole are formed by the same machine.

In one or more specific embodiments, the trench and the second hole are formed by exposing and developing the second dielectric layer, and the first dielectric layer and the first circuit layer function as stop layers.

In one or more specific embodiments, the operation of forming the metal layer includes forming a conductive seed layer on the portion of the first dielectric layer exposed by the trench and the portion of the first circuit layer exposed by the second hole; forming the metal layer by electroplating; and planarizing the metal layer to remove an upper portion of the metal layer, thereby exposing the second dielectric layer.

In one or more specific embodiments, the method further includes baking the first dielectric layer to cure the first dielectric layer before the second dielectric layer is formed.

In another aspect of the disclosure, a circuit board structure is provided. The circuit board structure includes a first circuit layer, a first dielectric layer, a second dielectric layer, a second circuit layer, and a conductive via. The first dielectric layer is disposed on the first circuit layer, in which the first dielectric layer has at least one first hole exposing a portion of the first circuit layer. The second dielectric layer is disposed on the first circuit layer and the first dielectric layer, in which the second dielectric layer has at least one trench and at least one second hole disposed in the first hole, the second hole exposes the first circuit layer, and the trench exposes the first dielectric layer. The second circuit layer is disposed in the trench. The conductive via is disposed in the second hole without contacting the first hole, in which a diameter of the second hole is smaller than a diameter of the first hole, and the conductive via has a bottom surface, a top surface, and a side surface connecting the bottom surface and the top surface.

In one or more specific embodiments, the trench is connected to the second hole, and the second circuit layer is connected to the conductive via.

In one or more specific embodiments, the second dielectric layer is formed from a photosensitive dielectric material.

Since the trench and the second hole are formed simultaneously or by the same machine, associated deviations can be basically avoided. Therefore, the diameter of the upper part of the second hole needs not to be greater than the diameter of the lower part of the second hole, and the upper part of the conductive via filling the second hole does not have a ring structure. Consequently, the space occupied by the conductive via in the second dielectric layer is effectively reduced, and there is more space in the second dielectric layer for disposing the second circuit layer, such that the layout density of the circuit board structure can be higher.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1A:
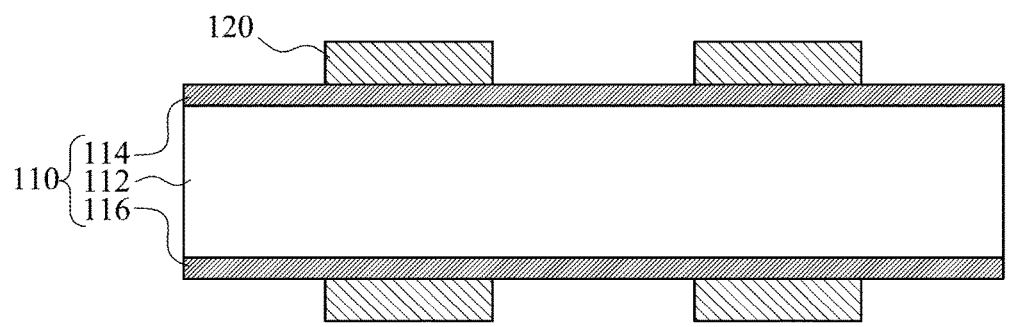
FIGS. 1A to 1I are schematic cross-sectional views of intermediate stages showing a method for manufacturing a circuit board structure according to one embodiment of this invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

In order to achieve high integration and miniaturization of the semiconductor components, standards of the circuit boards are also raised. For example, the layout density of the circuit boards is required to become higher. Herein, a method for manufacturing a circuit board structure is provided, and the layout density of the circuit board structure can be increased by using the specially designed manufacturing process.

FIGS. 1A to 1I are schematic cross-sectional views of intermediate stages showing a method for manufacturing a circuit board structure 100 according to one embodiment of this invention. It is noted that due to the characteristics of process machine, each element by each operation of the manufacturing method is symmetrically disposed on both sides of a carrier 110, but only the elements formed on one side of the carrier 110 are discussed below. Embodiments of this disclosure are not limited thereto. In other embodiments, the manufacturing method forms the elements on only one side of the carrier 110.

The carrier 110 includes a core layer 112 and conductive layers 114 and 116 respectively disposed on two sides of the core layer 112.

The core layer 114 may be formed from a metal, a dielectric material, or a combination thereof. For example, the core layer 112 may be copper clad laminate (CCL).

The conductive layers 114 and 116 may be copper foils or conductive seed layers. Embodiments of this disclosure are not limited thereto. People having ordinary skill in the art can make proper modifications to the conductive layers 114, 116 depending on actual applications.

As shown in FIG. 1A, a first circuit layer 120 is formed on the carrier 110.

The first circuit layer 120 may be formed by the following operations. First, a photoresist layer (not shown), such as a dry film, is formed on the carrier 110. Then, the photoresist layer is patterned to expose a portion of the carrier 110 by a lithography process. Then, the first circuit layer 120 is formed by plating, and then the photoresist layer is removed.

The first circuit layer 120 may be formed from a metal, such as silver, nickel, copper, gold, palladium, or a combination thereof. Embodiments of this disclosure are not limited thereto. People having ordinary skill in the art can make proper modifications to the first circuit layer 120 depending on the actual application.

Figure 1B:
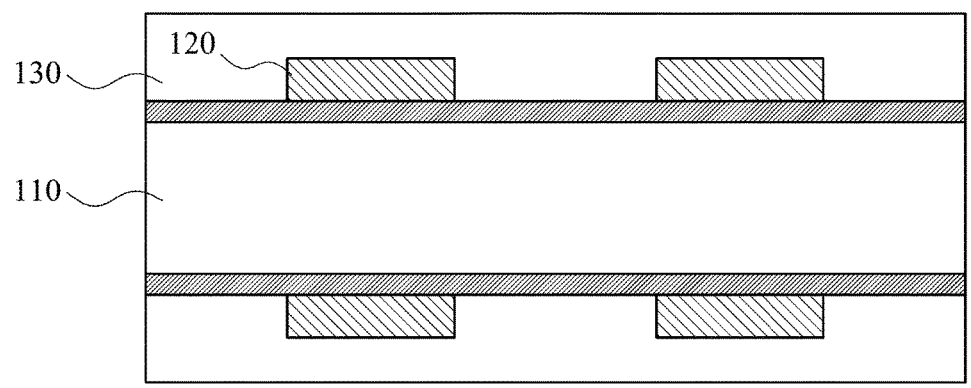

As shown in FIG. 1B, a first dielectric layer 130 is formed on the carrier 110 and the first circuit layer 120.

The first dielectric layer 130 may be formed from a photosensitive dielectric material, such as DIF03 manufactured by Hitachi. Embodiments of this disclosure are not limited thereto. People having ordinary skill in the art can make proper modifications to the first dielectric layer 130 depending on the actual application.

The first dielectric layer 130 may be formed by lamination or coating. Embodiments of this disclosure are not limited thereto. People having ordinary skill in the art can make proper modifications to the first dielectric layer 130 depending on the actual application.

Figure 1C:
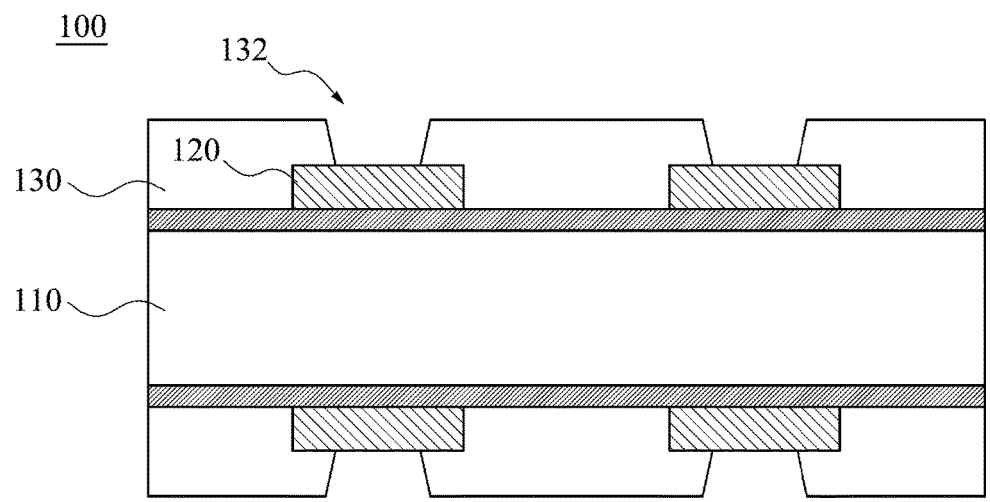

As shown in FIG. 1C, at least one first hole 132 is formed in the first dielectric layer 130, and the first hole 132 exposes a portion of the first circuit layer 120.

The first hole 132 is formed by exposing and developing the first dielectric layer 130, and the first dielectric layer 130 functions as a stop layer. After the first hole 132 is formed, the first dielectric layer 130 is baked to cure the first dielectric layer 130.

In another embodiment, the first hole 132 is formed by ablating the first dielectric layer 130 by laser, in which the first circuit layer 120 functions as the stop layer. In addition, in the embodiment, the first dielectric layer 130 may be a photosensitive dielectric material or a non-photosensitive dielectric material. If the first dielectric layer 130 is a photosensitive dielectric material, the first dielectric layer 130 is baked to cure the first dielectric layer 130 before the first hole 132 is formed.

Figure 1D:
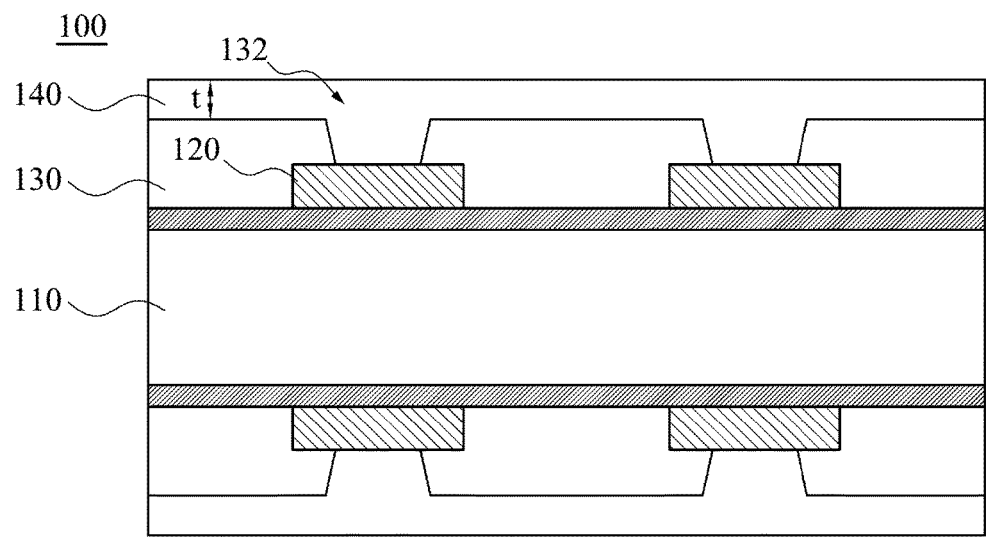

As shown in FIG. 1D, a second dielectric layer 140 is formed on the first dielectric layer 130 and the first circuit layer 120. Therefore, a portion of the second dielectric layer 140 is disposed in the first hole 132.

The second dielectric layer 140 is formed from a photosensitive dielectric material, such as DIF03 manufactured by Hitachi. Embodiments of this disclosure are not limited thereto. People having ordinary skill in the art can make proper modifications to the second dielectric layer 140 depending on the actual application.

The second dielectric layer 140 may be formed by lamination or coating. Embodiments of this disclosure are not limited thereto. People having ordinary skill in the art can make proper modifications to the second dielectric layer 140 depending on the actual application.

The thickness t of the second dielectric layer 140 (for example, the thickness of the portion of the second dielectric layer 140 disposed on the first dielectric layer 130) may be in a range from about 10 μm to about 20 μm. Or, the thickness t of the second dielectric layer 140 may be about 15 μm.

Figure 1E:
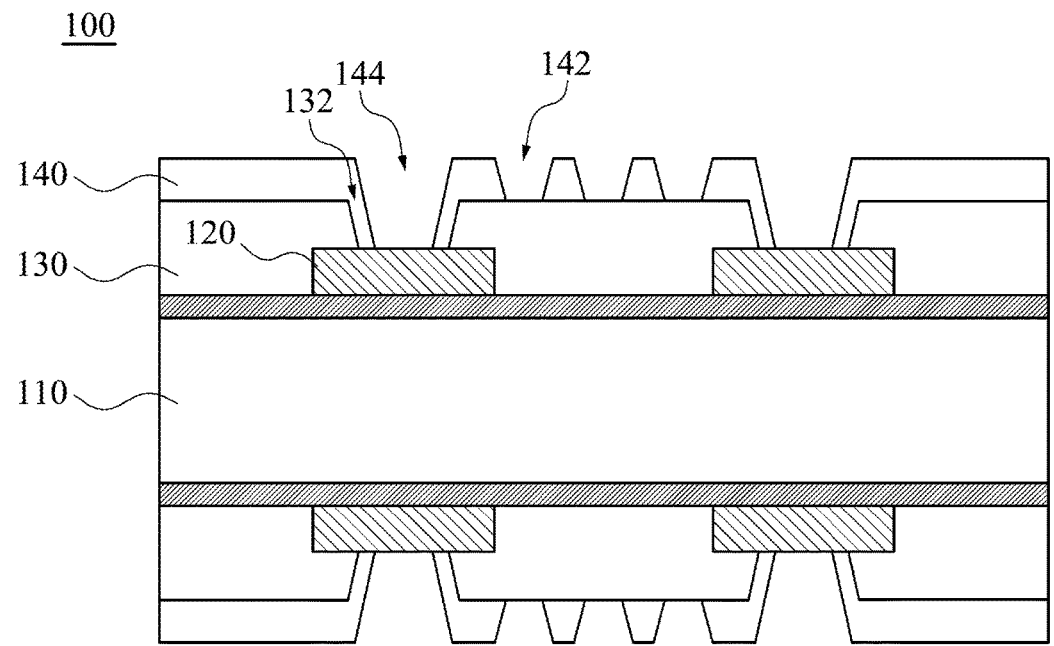

As shown in FIG. 1E, at least one trench 142 is formed in the second dielectric layer 140, and a second hole 144 is formed in a portion of the second dielectric layer 140 corresponding to the first hole 132. The trench 142 exposes a portion of the first dielectric layer 130, and the second hole 144 exposes a portion of the first circuit layer 120 and is disposed in the first hole 132. The diameter of the second hole 144 is smaller than the diameter of the first hole 132.

The trench 142 and the second hole 144 are formed by exposing and developing the second dielectric layer 140, and the first dielectric layer 130 and the first circuit layer 120 function as stop layers. After the trench 142 and the second hole 144 are formed, the second dielectric layer 140 is baked to cure the second dielectric layer 140.

Some of the trenches 142 may be connected to some of the second holes 144, and some of the trenches 142 may be connected to each other.

In the embodiment, the trench 142 and the second hole 144 are formed simultaneously, and the trench 142 and the second hole 144 are formed by the same mask.

In another embodiment, the trench 142 and the second hole 144 are formed by direct image exposure. First, the second dielectric layer 140 is exposed by using a laser head of a direct image exposure device with a lower energy to form the trench 142. Then, without moving the carrier 110, the second dielectric layer 140 is exposed by the laser head of the direct image exposure device with higher energy to form the second hole 144. The order of forming the trench 142 and the second hole 144 can be changed, i.e., the second hole 144 can be formed before the trench 142 is formed. In sum, the trench 142 and the second hole 144 are formed by the same machine without moving the carrier 110.

Figure 1F:
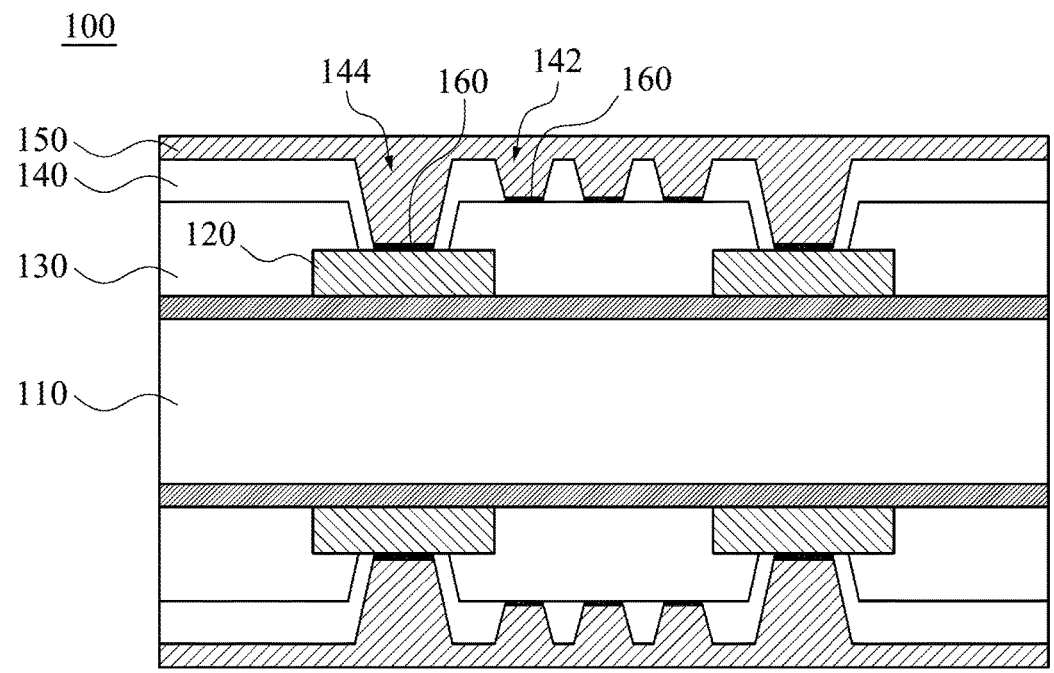

As shown in FIG. 1F, a metal layer 150 fills the trench 142 and the second hole 144.

First, a conductive seed layer 160 is formed on the portion of the first dielectric layer 130 exposed by the trench 142 and the portion of the first circuit layer 120 exposed by the second hole 144. Then, the metal layer 150 is formed by electroplating.

The metal layer 150 may be formed from silver, nickel, copper, gold, palladium, or a combination thereof. The conductive seed layer 160 may be formed from electroplated copper, electroplated palladium, or sputtered metal such as sputtered copper or sputtered titanium copper (Ti/Cu). Embodiments of this disclosure are not limited thereto. People having ordinary skill in the art can make proper modifications to the metal layer 150 and the conductive seed layer 160 depending on actual applications.

Figure 1G:
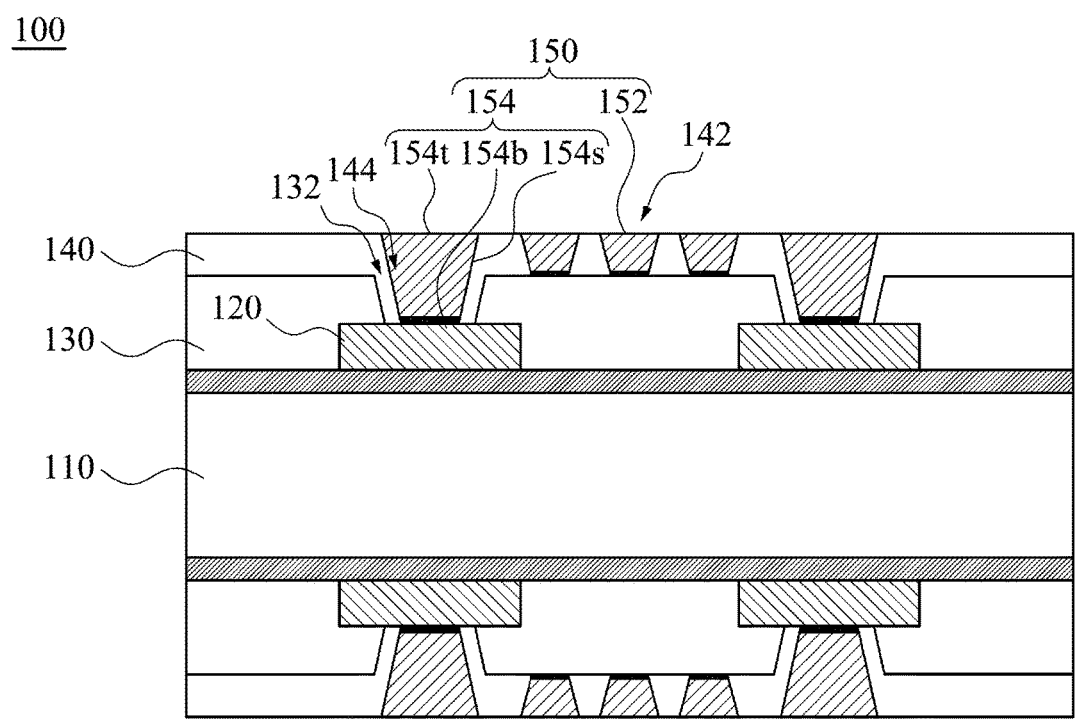

As shown in FIG. 1G, the metal layer 150 is planarized to remove an upper portion of the metal layer 150, such that the second dielectric layer 140 is exposed. Therefore, the metal layer 150 filling the trench 142 and the second hole 144 forms lines embedded in the second dielectric layer 140 (such as embedded lines).

The portion of the metal layer 150 filling the trench 142 becomes a second circuit layer 152, and the portion of the metal layer 150 filling the second hole 144 becomes a conductive via 154. The conductive via 154 has a bottom surface 154b, a top surface 154t, and a side surface 154s connecting the bottom surface 154b and the top surface 154t. The side surface 154s is a continuously extending curved surface or a plane surface. In other words, the conductive via 154 is a column such as a circular column or a trapezoidal column.

The height of the conductive via 154 (such as the distance between the top surface 154t and the bottom surface 154b) may be in a range from about 30 µm to about 50 µm. The height of the conductive via 154 may be about 40 µm.

The diameter of the top surface 154t may be in a range from about 10 µm to about 60 µm, in a range from about 15 µm to about 50 µm, or in a range from about 20 µm to 30 µm. Embodiments of this disclosure are not limited thereto. People having ordinary skill in the art can make proper modifications to the diameter of the top surface 154t depending on actual applications.

Because some of the trenches 142 may be connected to each other, different portions of the metal layer 150 filling the trenches 142 (such as the second circuit layer 152) may be connected to each other. Because some of the trenches 142 may be connected to some of the second holes 144, the portion of the metal layer 150 filling the trenches 142 (for example, the second circuit layer 152) is connected to the portion of the metal layer 150 filling the second hole 144 (such as the conductive via 154).

The planarization may be performed by brushing, chemical-mechanical polishing (CMP), etc. Embodiments of this disclosure are not limited thereto. People having ordinary skill in the art can make proper modifications to the planarization depending on the actual application.

Figure 1H:
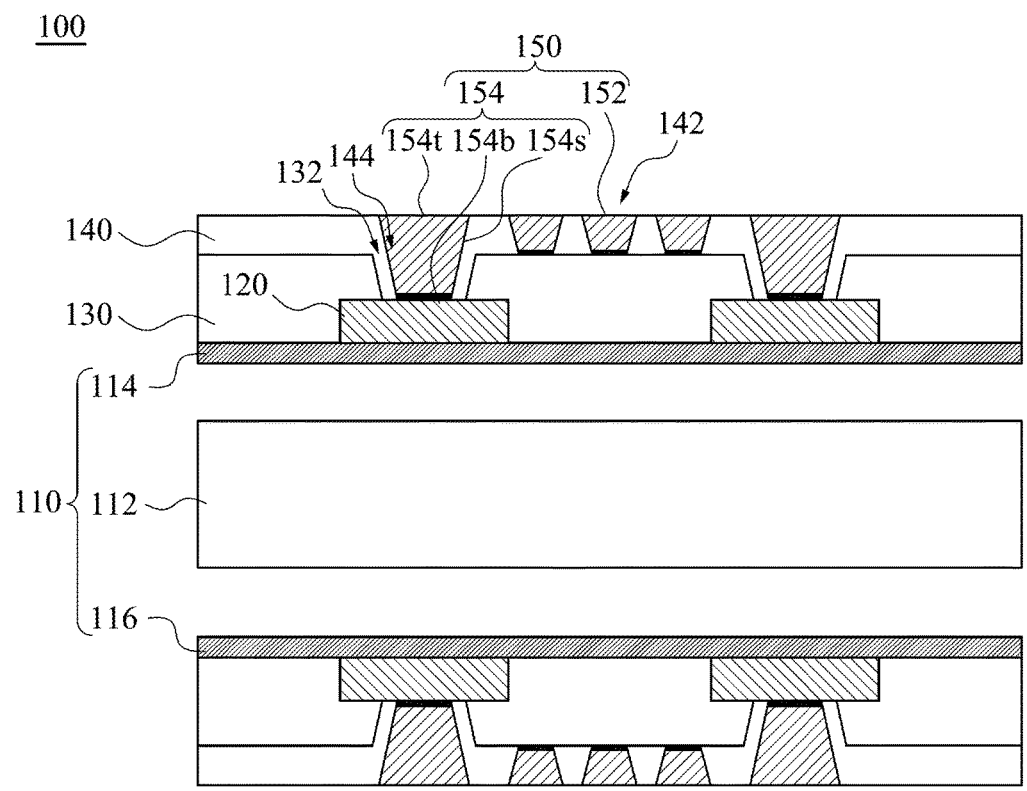

As shown in FIG. 1H, after the metal layer 150 is planarized to remove the upper portion of the metal layer 150, the core layer 112 is removed, i.e., the conductive layer 114 is separated from the core layer 112 (meanwhile the conductive layer 116 is also separated from the core layer 112).

The operation of removing the core layer 112 has no specific limitation. For example, the core layer 112 may be removed before the circuit board structure 100 is packaged or after the circuit board structure 100 is packaged.

Figure 1I:
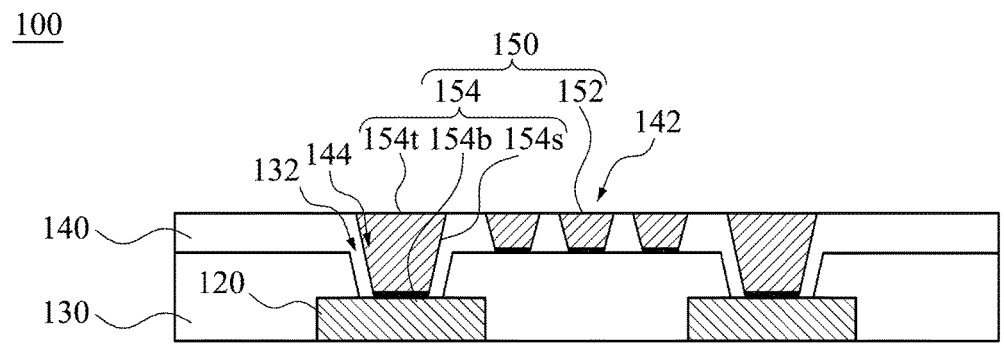

As shown in FIG. 1H and FIG. 1I, the conductive layer 114 is removed to form the coreless circuit board structure 100.

In conventional progress, although the trench and the upper part of the second hole are generally formed by the same process, the lower part of the second hole are formed by a process different from the process forming the trench and the upper part of the second hole. Therefore, deviations may be generated when the upper part and the lower part of the second hole are formed. In order to prevent the deviations from affecting the entire structure, the diameter of the upper part of the second hole is made to be greater than the diameter of the lower part of the second hole, such that the upper part of the second hole is aligned with the lower part of the second hole. Consequently, compared to the lower part of the conductive via filling the second hole, the upper part of the conductive via have a ring structure.

In contrast, in the aforementioned method, since the trench 142 and the second hole 144 are formed simultaneously or formed by the same machine, associated deviations can be avoided basically. Therefore, the diameter of the upper part of the second hole 144 need not to be greater than the diameter of the lower part of the second hole 144, and the upper part of the conductive via 154 filling the second hole 144 does not have the ring structure. Consequently, the space occupied by the conductive via 154 in the second dielectric layer 140 is effectively reduced, and there is more space in the second dielectric layer 140 to dispose the second circuit layer 152, such that the layout density of the circuit board structure 100 can be higher.

As shown in FIG. 1I, which shows the circuit board structure 100 manufactured by the method of FIGS. 1A to 1I, the circuit board structure 100 includes the first circuit layer 120, the first dielectric layer 130, the second dielectric layer 140, the second circuit layer 152, and the conductive via 154. The first dielectric layer 130 is disposed on the first circuit layer 120, in which the first dielectric layer 130 has at least one first hole 132 to expose a part of the first circuit layer 120. The second dielectric layer 140 is disposed on the first circuit layer 120 and the first dielectric layer 130, in which the second dielectric layer 140 has at least one trench 142 and at least one second hole 144, the second hole 144 is disposed in the first hole 132, the second hole 144 exposes the first circuit layer 120, and the trench 142 exposes the first dielectric layer 130. The second circuit layer 152 is disposed in the trench 142. The conductive via 154 is disposed in the second hole 144, in which the conductive via 154 does not contact the first hole 132, the diameter of the second hole 144 is smaller than the diameter of the first hole 132, and the conductive via 154 has a bottom surface 154b, a top surface 154t, and a side surface 154s connecting the bottom surface 154b and the top surface 154t.

Figure 2:
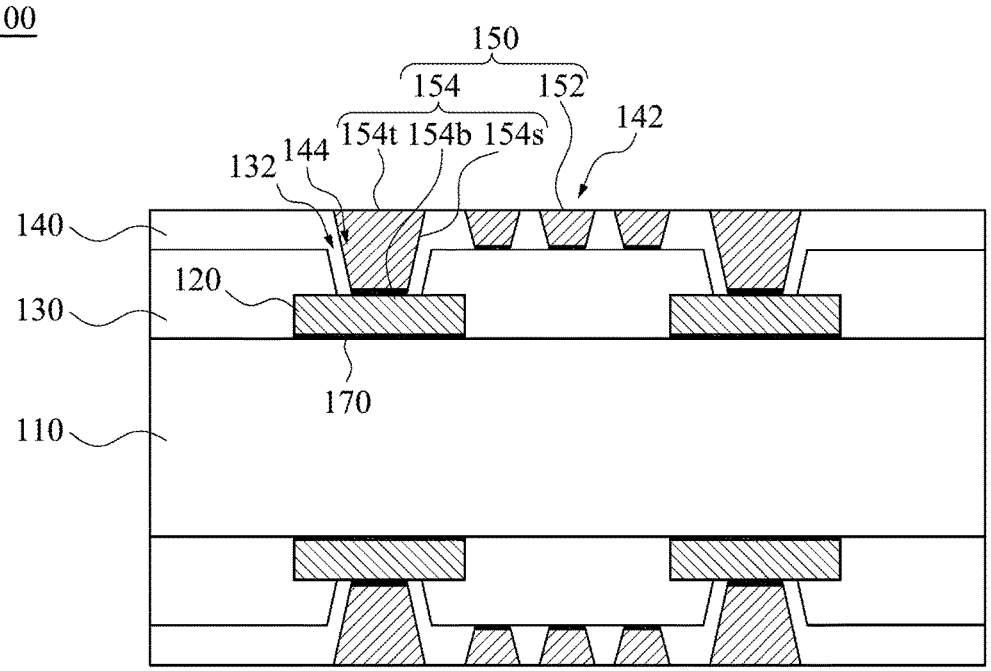
FIG. 2 is a schematic cross-sectional view of the circuit board structure according to another embodiment of this invention.

FIG. 2 is a cross-sectional view of the circuit board structure 100 according to another embodiment of this invention. The circuit board structure 100 of FIG. 2 is similar to the circuit board structure 100 of FIG. 1I, and the differences are discussed below.

As shown in FIG. 2, the circuit board structure 100 further includes the carrier 110. The first circuit layer 120 is disposed on the carrier 110. The first dielectric layer 130 is disposed on the carrier 110 and the first circuit layer 120.

In addition, the circuit board structure 100 further includes a conductive seed layer 170, and the conductive seed layer 170 is disposed between the carrier 110 and the first circuit layer 120. The function of the conductive seed layer 170 is to form the first circuit layer 120, which is similar to the function of the conductive layer 114, 116 of FIG. 1A.

The conductive seed layer 170 may be made of electroplated copper, electroplated palladium, or sputtered metal such as sputtered copper or sputtered titanium copper. Embodiments of this disclosure are not limited thereto. People having ordinary skill in the art can make proper modifications to the conductive seed layer 170 depending on the actual application.

Since the trench 142 and the second hole 144 are formed simultaneously or formed by the same machine, associated deviations can be basically avoided. Therefore, the diameter of the upper part of the second hole 144 does not have to be greater than the diameter of the lower part of the second hole 144, and the upper part of the conductive via 154 filling the second hole 144 does not have the ring structure. Consequently, the space occupied by the conductive via 154 in the second dielectric layer 140 is effectively reduced, and there is more space in the second dielectric layer 140 to dispose the second circuit layer 152, such that the layout density of the circuit board structure 100 can be higher.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. §112, 6th paragraph. In particular, the use of "step of" in the claims herein is not intended to invoke the provisions of 35 U.S.C. §112, 6th paragraph.

What is claimed is:

1. A circuit board structure, comprising:
    a first circuit layer;
    a first dielectric layer disposed on the first circuit layer, wherein the first dielectric layer has at least one first hole exposing a portion of the first circuit layer;
    a second dielectric layer disposed on the first circuit layer and the first dielectric layer, wherein the second dielectric layer has at least one trench and at least one second hole disposed in the first hole, the second hole exposing the first circuit layer, the trench exposing the first dielectric layer;
    a second circuit layer disposed in the trench; and
    a conductive via disposed in the second hole without contacting the first hole, wherein a diameter of the second hole is smaller than a diameter of the first hole, and the conductive via has a bottom surface, a top surface, and a side surface connecting the bottom surface and the top surface.

2. The circuit board structure of claim 1, wherein the trench is connected to the second hole, and the second circuit layer is connected to the conductive via.

3. The circuit board structure of claim 1, wherein the second dielectric layer is formed from a photosensitive dielectric material.

4. A method for manufacturing a circuit board structure, the method comprising:
    forming a first circuit layer on a carrier;
    forming a first dielectric layer on the carrier and the first circuit layer;
    forming at least one first hole in the first dielectric layer, wherein the first hole exposes a portion of the first circuit layer;
    forming a second dielectric layer on the first dielectric layer and the first circuit layer;
    forming at least one trench in the second dielectric layer, and forming a second hole in a portion of the second dielectric layer corresponding to the first hole, the trench exposing a portion of the first dielectric layer, the second hole exposing the portion of the first circuit layer, wherein the second hole is disposed in the first hole, and a diameter of the second hole is smaller than a diameter of the first hole; and
    forming a metal layer filling the trench and the second hole, wherein a portion of the metal layer filling the trench becomes a second circuit layer, and another portion of the metal layer filling the second hole becomes a conductive via.

5. The method of claim 4, wherein the trench and the second hole are formed simultaneously.

6. The method of claim 4, wherein the trench and the second hole are formed by the same machine.

7. The method of claim 4, wherein the trench and the second hole are formed by exposing and developing the second dielectric layer, and the first dielectric layer and the first circuit layer function as stop layers.

8. The method of claim 4, wherein the operation of forming the metal layer comprises:
    forming a conductive seed layer on the portion of the first dielectric layer exposed by the trench and the portion of the first circuit layer exposed by the second hole;
    forming the metal layer by electroplating; and
    planarizing the metal layer to remove an upper portion of the metal layer, thereby exposing the second dielectric layer.

9. The method of claim 4, further comprising:
    baking the first dielectric layer to cure the first dielectric layer before the second dielectric layer is formed.

* * * * *